United States Patent
Tseng

(10) Patent No.: US 7,180,333 B2
(45) Date of Patent: Feb. 20, 2007

(54) CURRENT MODE LOGIC DRIVER THAT EMPLOYS A LEVEL SHIFTING MECHANISM

(75) Inventor: Pei-Der Tseng, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/445,171

(22) Filed: May 20, 2003

(65) Prior Publication Data

US 2004/0232945 A1    Nov. 25, 2004

(51) Int. Cl.
    *H03K 19/094*    (2006.01)
(52) U.S. Cl. .................. 326/115; 326/127; 327/66
(58) Field of Classification Search ............... 326/112, 326/115, 127, 83; 327/66
    See application file for complete search history.

(56) References Cited

U.S. PATENT DOCUMENTS

| | | | |
|---|---|---|---|
| 4,713,560 A | 12/1987 | Herndon | |
| 4,999,519 A | 3/1991 | Kitsukawa et al. | |
| 6,191,635 B1 | 2/2001 | Thompson et al. | |
| 6,222,386 B1 | 4/2001 | Alford et al. | |
| 6,255,857 B1 | 7/2001 | Iliasevitch | |
| 6,292,031 B1* | 9/2001 | Thompson et al. | 327/66 |
| 6,788,142 B2* | 9/2004 | Li et al. | 330/253 |

FOREIGN PATENT DOCUMENTS

| | | |
|---|---|---|
| EP | 0453191A30 | 4/1991 |
| EP | 1063774 A1 | 12/2000 |

OTHER PUBLICATIONS

"A Low Voltage, Rail-to-Rail, Class AB CMOS Amplifier With High Drive and Low Output Impedance Characteristics," Gabriel A. Rincon-Mora and Richard Stair, IEEE Transactions on Circuits and Systems-II: Analog and Digital Signal Processing, vol. 48, No. 8, pp. 753 to 761, Aug. 2001.
"A Versatile 3.3/2.5/1.8-V I/O Driver Built in a 0.2-mm, 3.5-nm Tox, 1,8-V CMOS Technology," Hector Sanchez,-Joshua Siegel, Carmine; Nicoletta, James P. Nissen and Jose Alvarez, IEEE Journal of Solid State Circuits, vol. 34, No. 11, pp. 1501 to 1511, Nov. 1999.

* cited by examiner

*Primary Examiner*—Daniel D. Chang

(57) ABSTRACT

Circuit for providing drive signal waveforms. The circuit includes a current mode logic (CML) driver that includes a common mode voltage (VCM), an output node and a complementary output node. The circuit also has a level shifting mechanism that is coupled to the CML driver. The level shifting mechanism adjusts the common mode voltage (VCM) by either drawing a level shifting current from the output node and the complementary output node or injecting a level shifting current into the output node and the complementary output node.

20 Claims, 9 Drawing Sheets

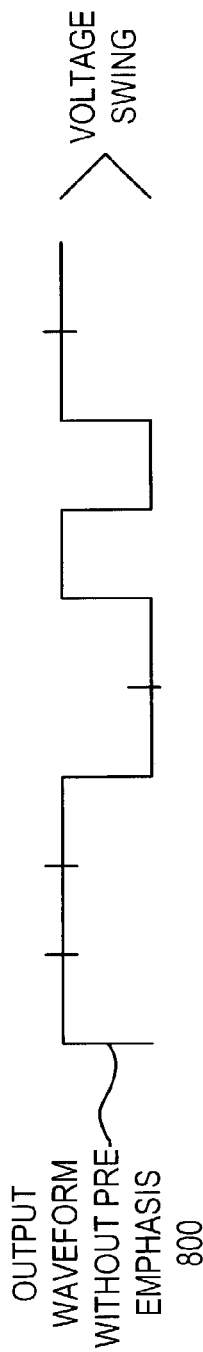
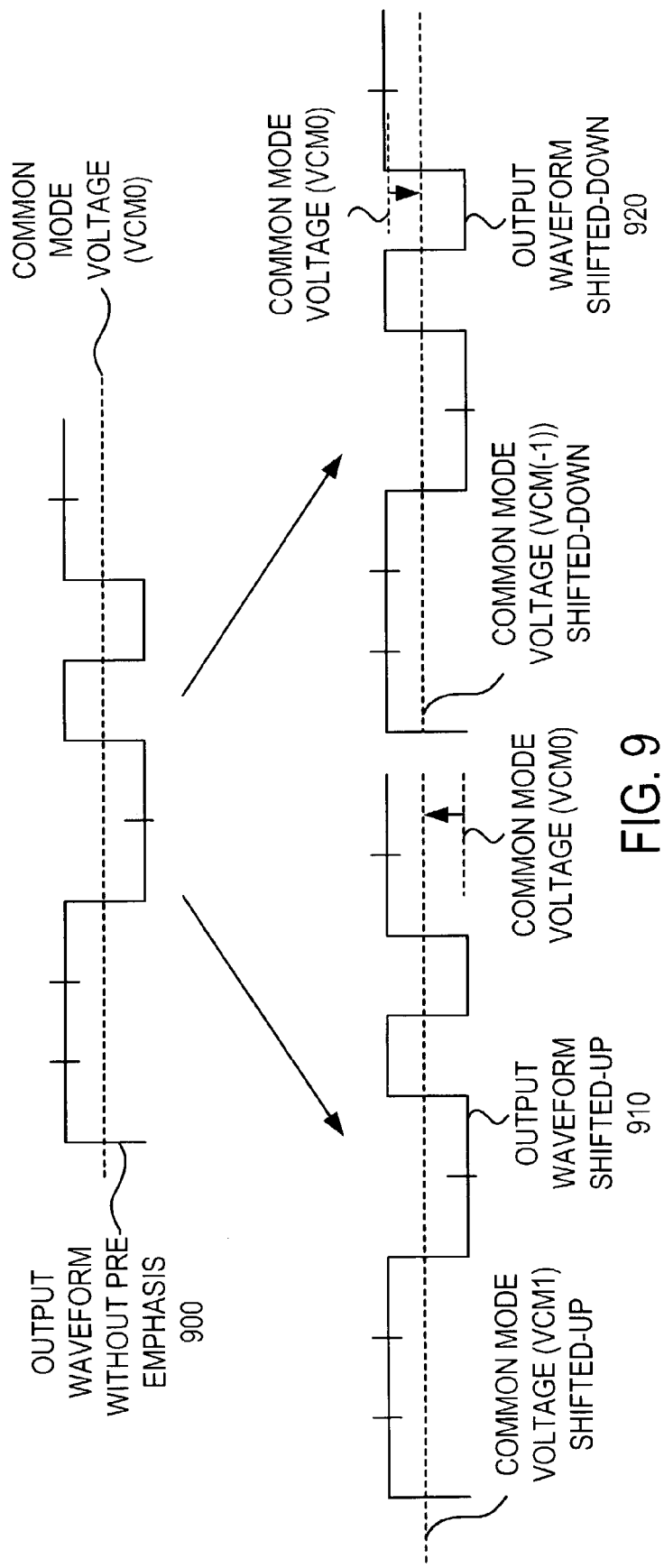

CURRENT MODE LOGIC DRIVER THAT EMPLOYS A LEVEL SHIFTING MECHANISM

FIELD OF THE INVENTION

The present invention relates generally to signal shaping circuits, and more particularly, to a current mode logic driver that employs a level shifting mechanism.

BACKGROUND OF THE INVENTION

Interface circuits are important for converting signals between systems that have different signal requirements (e.g., a first integrated circuit that has a first set of signal requirements and a second integrated circuit that has a second set of signal requirements). These interface circuits can be incorporated in the first IC as a last output stage, in the second IC as a first input stage, or as a stand-alone circuit that is interposed between the first IC and the second IC.

One trend in electronic systems is the reduction in the power supply voltage (e.g., Vcc). These systems that operate with lower power supply voltages are especially conducive for low-power consumption applications (e.g., portable electronic devices) since a lower power supply voltage leads to lower power consumption. However, as the supply voltage in systems is reduced, it becomes more of a challenge to meet certain electrical specifications. For example, certain requirements, such as voltage swing and common mode voltage, are increasing difficult to meet especially as the supply voltage for electronic systems decreases.

One example, of a specification with strict electrical requirements is the InfiniBand™ Architecture Specification. InfiniBand Trade Association publishes InfiniBand™ Architecture Specification Release 1.1, Vol. 1 and Vol. 2 (released Nov. 6, 2002) (see http://www.infinibandta.org/specs/register/publicspec/). This specification sets forth various parameters and requirements for the electrical, optical, mechanical specifications for use by designers of products and components that are compliant with the InfiniBand™ Architecture.

Interface circuits typically employ a wave-shaping or conditioning circuit to generate an output waveform to drive the next stage with signals that conform to the requirements of the next stage (e.g., a system compliant with the InfiniBand™ Architecture Specification). One important function of such a wave-shaping circuit is to shift the voltage level of the signals. In other words, shifting the voltage level is an important aspect in the design of the wave shaping or conditioning circuit. There are different approaches to shifting the voltage level in a circuit.

One approach is described in U.S. Pat. No. 4,713,560 that is entitled, "Switched impedance emitter coupled logic gate" (Inventor: William H. Herndon). U.S. Pat. No. 4,713,560 is directed to a circuit that uses emitter followers to level shift from the collectors of a differential pair. FETs that are connected at the differential pair collector nodes are used to adjust the output impedance. Unfortunately, one disadvantage of this approach is that it is difficult to control the output impedance by using emitter/source followers. Another disadvantage of this approach is that the output impedance of emitter/source followers is typically small, which can pose a problem for those applications that require a larger output impedance for the next stage.

A second approach is described in U.S. Pat. No. 4,999,519 that is entitled, "Semiconductor circuit with low power consumption having emitter-coupled logic or differential amplifier" (Inventors: Goro Kitsukawa et al.). U.S. Pat. No. 4,999,519 is directed to a circuit that also uses emitter followers to level shift from the collectors of a differential pair. FETs and resistors that are connected at the differential pair collector nodes are either OFF or operating in the linear region to disable or enable the emitter follower input.

Unfortunately, as noted earlier, one disadvantage of an approach that employs emitter/source followers is that it is difficult to control the output impedance by using emitter/source followers. Furthermore, as noted earlier, the output impedance of emitter/source followers is typically small, which can pose a problem for those applications that require a larger output impedance for the next stage.

A resistor can be coupled in series with the output port in order to increase the output impedance. However, adding the resistor consumes voltage swing, thereby decreasing the maximum output swing, which for certain applications is undesirable.

Another approach is described in U.S. Pat. No. 6,255,857 entitled, "Signal level shifting circuits" (Inventor: Stepan Iliasevitch). This approach employs stacked diodes to shift down the signal. One disadvantage of this approach is that the circuit can only shift the voltage in integer multiples of the diode turn-on voltage. Moreover, this approach does not appear to be designed to support systems with a low power supply voltage.

Yet another approach is to use source followers operating at class AB to level shift a signal. An example of this approach is described in a paper entitled, "A Low Voltage, Rail-to-Rail, Class AB CMOS Amplifier With High Drive and Low Output Impedance Characteristics," Gabriel A. Rincon-Mora and Richard Stair, IEEE Transactions on Circuits and Systems—II: Analog and Digital Signal Processing, Vol. 48, No. 8, pages 753 to 761, August 2001. One disadvantage of this approach is that for low voltage applications (e.g., applications with a low supply voltage, $V_{CC}$), the source follower does not provide a 50 ohm output impedance and a large voltage swing. Furthermore, the class AB CMOS amplifier level shifts the input common mode voltage of the output stage and not the common mode output voltage, which is required in some applications.

Another approach is to use cross-coupled pFET to level shift a signal. A first example of this approach is described in a paper entitled, "A Versatile 3.3/2.5/1.8-V I/O Driver Built in a 0.2-µm, 3.5-nm Tox, 1.8-V CMOS Technology," Hector Sanchez, Joshua Siegel, Carmine Nicoletta, James P. Nissen and Jose Alvarez, IEEE Journal of Solid State Circuits, Vol. 34, No. 11, pages 1501 to 1511, November 1999. A second example of this approach is described in a paper entitled, "A Versatile 3.3/2.5/1.8-V I/O Driver Built in a 0.2-µm, 3.5-nm Tox, 1.8-V CMOS Technology," Wen-Tai Wang, Ming-Dou Ker, Mi-Chang Chiang and Chung-Hui Chen, 2001 International Symposium on VLSI Technology, Systems, and Applications, Proceedings of Technical Papers, pages 307 to 310, 2001.

One disadvantage of this approach is that the approach is directed to single-ended applications (e.g., digital circuits). Unfortunately, this approach is not suitable for differential signal applications.

Based on the foregoing, there remains a need for a wave shaping circuit that overcomes the disadvantages set forth previously.

SUMMARY OF THE INVENTION

According to one embodiment of the present invention, a circuit for providing drive signal waveforms is described. The circuit includes a current mode logic (CML) driver that includes a common mode voltage (VCM), an output node and a complementary output node. The circuit also has a level shifting mechanism that is coupled to the CML driver. The level shifting mechanism adjusts the common mode voltage (VCM) by either drawing a level shifting current from the output node and the complementary output node or injecting a level shifting current into the output node and the complementary output node.

BRIEF DESCRIPTION OF THE DRAWINGS

The present invention is illustrated by way of example, and not by way of limitation, in the figures of the accompanying drawings and in which like reference numerals refer to similar elements.

FIG. 8 illustrates an exemplary output signal waveform without pre-emphasis.

FIG. 9 illustrates exemplary output signal waveforms that are level-shifted versions of the output signal waveform of FIG. 8.

DETAILED DESCRIPTION

Current mode logic (CML) driver that employs a level shifting mechanism is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Module 100

Figure 1:
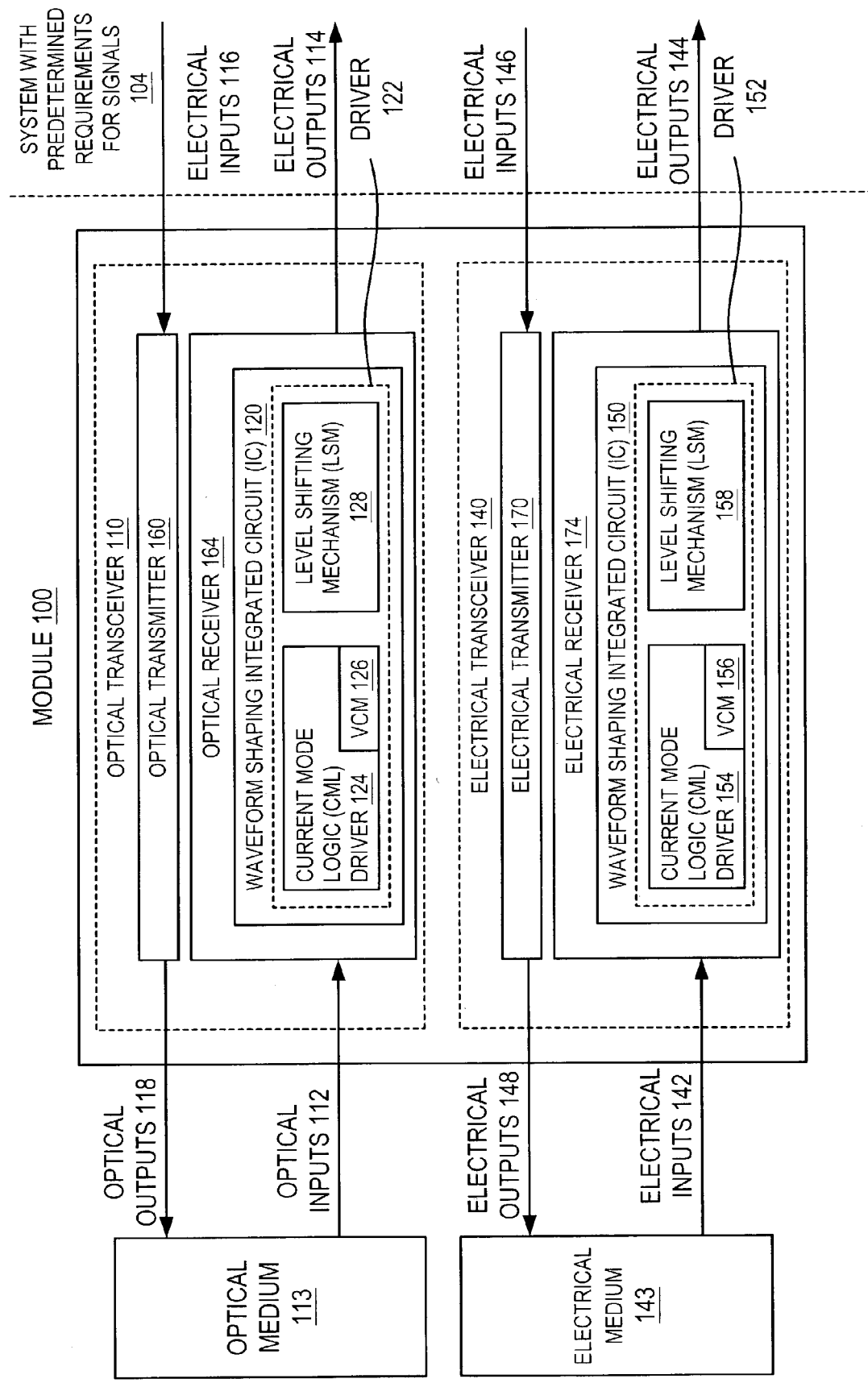
FIG. 1 illustrates a module in which the driver circuit according to the invention can be implemented.

FIG. 1 illustrates a module 100 in which the driver circuit 122, 152 according to the invention can be implemented. The module 100 is coupled to interact and communicate data with a system 104 that has predetermined signal requirements or specifications. For example, the system 104 can comply with the requirements set forth in InfiniBand Trade Association publishes InfiniBand™ Architecture Specification Release 1.1, Vol. 1 and Vol. 2 (released Nov. 6, 2002) (see http://www.infinibandta.org/specs/register/public-spec/). This specification sets forth various parameters and requirements for the electrical, optical, mechanical specifications for use by designers of products and components that are compliant with the InfiniBand™ Architecture.

Optical Transceiver 110

The module can include an optical transceiver 110 that has 1) optical inputs 112 for receiving an optical signal from an optical medium 113 (e.g., a fiber optic cable), 2) electrical outputs 114 for providing an electrical signal (e.g., an electrical corresponding to the optical signal received at inputs 112), 3) electrical inputs 116 for receiving an electrical signal from the system 104, and 4) optical outputs 118 for providing an optical signal (e.g., an optical signal corresponding to the electrical signal received at inputs 116) to the optical medium 113.

The optical transceiver 110 includes an optical transmitter 160 and an optical receiver 164. The optical transmitter 160 includes electrical inputs 116 for receiving an electrical signal from the system 104. The optical transmitter 160 converts the received electrical signal into a corresponding optical signal and provides the optical signal at optical outputs 118 to the optical medium 113. The optical receiver 164 includes optical inputs 112 for receiving optical signals from the optical medium 113. The optical receiver 164 converts the received optical signals into a corresponding electrical signal in a format suitable for system 104 and provides the electrical signal at electrical outputs 114 to the system 104.

Typically, the optical signal is converted into an electrical signal by a photo detector. The resulting electrical signal is then conditioned and processed into a format acceptable to system 104 by a circuit, such as a waveform shaping integrated circuit described herein below.

The optical receiver 164 includes a waveform shaping integrated circuit (IC) 120 for performing processing on the received signal to condition and shape the signal so that the signal conforms to the specifications required by system 104. The waveform shaping integrated circuit (IC) 120 includes a driver circuit 122 according to the invention. The driver circuit 122 includes a current mode logic (CML) driver 124 for generating a drive waveform that has a common mode voltage (VCM) 126 and a level shifting mechanism (LSM) 128 that is coupled to the CML driver 124. The level shifting mechanism (LSM) 128 adjusts, changes, varies, or modifies (e.g., increases or decreases) the common mode voltage (VCM) 126.

The waveform shaping IC 120 can also include other circuits, such as receiver circuit, clock data recovery circuit, voltage controlled oscillator (VCO), etc., whose construction and operation are known by those of ordinary skill in the art.

Electrical Transceiver 140

The module 100 can include an electrical transceiver 140 that has 1) electrical inputs 142 for receiving an electrical signal from an electrical medium 143 (e.g., a conductive wire or cable), 2) electrical outputs 144 for providing an electrical signal (e.g., an electrical signal corresponding to the signal received at inputs 142) to the system 104, 3) electrical inputs 146 for receiving an electrical signal from the system 104, and 4) electrical outputs 148 for providing an electrical signal (e.g., an electrical signal corresponding to the signal received at inputs 146) to the electrical medium 143.

The electrical transceiver 140 includes an electrical transmitter 170 and an electrical receiver 174. The electrical transmitter 170 includes electrical inputs 146 for receiving electrical signals from the system 104. The electrical transmitter 170 converts the received electrical signals into a format suitable for another system (not shown) and provides the converted electrical signals at electrical outputs 148 to the electrical medium 143. The electrical receiver 174 includes electrical inputs 142 for receiving electrical signals from the electrical medium 143. The electrical receiver 174 converts the received electrical signals into a format suitable for the system 104 and provides the converted electrical signal at electrical outputs 144 to system 104.

The electrical receiver 174 includes a waveform shaping integrated circuit (IC) 150 for performing processing on the received signal to condition and shape the signal so that the signal conforms to the specifications required by system 104. For example, the electrical signal is conditioned and processed into a format acceptable to system 104.

The waveform shaping integrated circuit (IC) 150 includes a driver circuit 152 according to the invention. The driver circuit 152 includes a current mode logic (CML) driver 154 for generating a drive waveform that has a common mode voltage (VCM) 156 and a level shifting mechanism (LSM) 158 that is coupled to the CML driver 154. The level shifting mechanism (LSM) 158 adjusts, changes, varies, or modifies (e.g., increases or decreases) the common mode voltage (VCM) 156.

It is noted that the module 100 can be a purely optical module in which the electrical transceiver 140 is absent. In this case, module 100 can be an optical receiver, an optical transmitter, or an optical transceiver 110 as shown. Similarly, it is noted that the module 100 can be a purely electrical module in which the optical transceiver 110 is absent. In this case, the module 100 can be an electrical receiver, an electrical transmitter, or an electrical transceiver 140 as shown. For example, the driver according to the invention can be implemented in an optical receiver, an electrical receiver, the optical receiver portion of an optical transceiver, or the electrical receiver portion of an electrical transceiver.

Driver Circuit 122, 152

Figure 2:
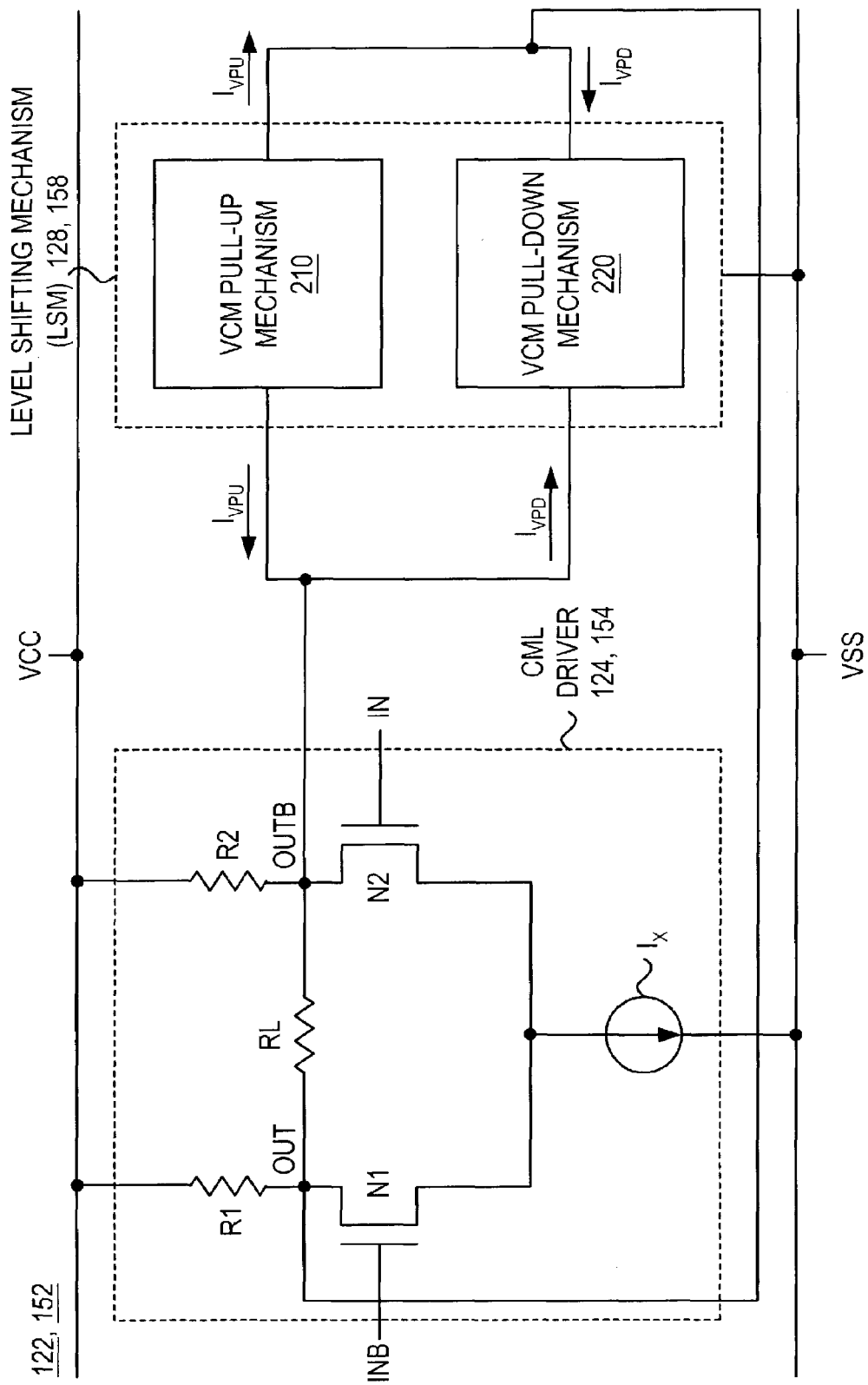
FIG. 2 illustrates in greater detail the driver circuit of FIG. 1 according to one embodiment of the invention.

FIG. 2 illustrates in greater detail the driver circuit 122, 152 of FIG. 1 according to one embodiment of the invention. The driver circuit 122, 152 includes a CML driver 124, 154, respectively, and a level shifting mechanism (LSM) 128, 158, respectively.

As described earlier, the current mode logic (CML) driver 124, 154 generates a drive waveform that includes a common mode voltage (VCM) (e.g., VCM 126 and VCM 156). The CML driver 124, 154 also includes an output node (OUT) and a complementary output node (OUTB). The first output node (OUT) and the second output node (OUTB) can be coupled to drive a load (e.g., a differential 100 ohm load) that may be represented, for example, by a resistance ($R_L$). The load may be, for example, the electronics in a next stage, a transmission medium (e.g., a cable or twisted pair), or the traces of a printed circuit board (PCB).

The level shifting mechanism 128, 158 is coupled to the CML driver 124, 154 for varying, changing, modifying, or adjusting the common mode voltage (VCM). For example, the level shifting mechanism 128, 158 can modify the common mode voltage (VCM) of the CML driver 124, 154 by drawing a level shifting current at the output node and the complementary output node or by injecting a level shifting current at the output node and the complementary output node.

Current Mode Logic (CML) Driver

In this embodiment, the current mode logic (CML) driver 124, 154 includes a single differential pair (transistors N1 & N2) for generating a waveform without pre-emphasis (e.g., the waveform illustrated in FIG. 8).

The current mode logic (CML) driver 124, 154 includes a current source ($I_X$) having a first electrode for coupling with a first predetermined voltage (e.g., Vss or ground potential) and a second electrode. The current mode logic (CML) driver 124, 154 includes a first transistor (N1) that has a drain electrode, a source electrode coupled to the second electrode of the current source, and a gate electrode for coupling to a complementary input node (INB). The current mode logic (CML) driver 124, 154 also includes a second transistor (N2) that has a drain electrode, a source electrode coupled to the second electrode of the current source, and a gate electrode for coupling to an input node (IN).

The current mode logic (CML) driver 124, 154 further includes a first resistor (R1) having a first electrode for coupling to the drain electrode of the first transistor (N1) and a second electrode for coupling to a second predetermined voltage (e.g., $V_{CC}$). The current mode logic (CML) driver 124, 154 also includes a second resistor (R2) that has a first electrode for coupling to the drain electrode of the second transistor (N2) and a second electrode for coupling to the second predetermined voltage (e.g., $V_{CC}$). In one embodiment, the resistance of R1 is equal to the resistance of R2, and the resistance has an exemplary value of 50 ohms. The load resistance (RL) can be, for example, 100 ohms.

An alternative embodiment of the current mode logic (CML) driver 124, 154 is described hereinafter with reference to FIG. 7 in which the (CML) driver 124, 154 includes a pre-emphasis configuration for generating a waveform with pre-emphasis (e.g., the waveforms illustrated in FIG. 11).

As described earlier, the current mode logic (CML) driver 124, 154 generates a drive waveform that has a common mode voltage (VCM). As described in greater detail with reference to FIG. 10, the drive waveform generated by the CML driver 124, 154 without the level shifting mechanism according to the invention can lead to distortion (e.g., clipping) of the waveform or a waveform that does not meet electrical signal requirements of a next stage. The level shifting mechanism according to the invention selectively adjusts the common mode voltage (VCM) of the drive waveform generated by the CML driver 126, 156 into a modified drive waveform as described in greater detail with reference to FIGS. 9 & 11. This modified drive waveform is generated by the driver 122, 152 according to the invention and has a common mode voltage that suits the needs of a particular application (e.g., a modified drive waveform that has reduced signal distortion or a modified drive waveform that meets an electrical specification, such as common mode voltage range).

Level Shifting Mechanism

The level shifting mechanism 128, 158 includes a VCM pull-up mechanism 210 for pulling up the common mode voltage (VCM) by injecting a level shifting current (i.e., a VCM pull-up current ($I_{VPU}$)) into the output node (OUT) and the complementary output node (OUTB).

The level shifting mechanism 128, 158 further includes a VCM pull-down mechanism 220 for pulling down the common mode voltage (VCM) by drawing a level shifting current (i.e., a VCM pull-down current ($I_{VPD}$)) from the output node (OUT) and the complementary output node (OUTB).

Voltage Swing for a CML Driver

In a current mode logic (CML) driver, it is difficult to have a large voltage swing. The voltage swing includes: 1) the voltage drop across resistors (R1 or R2), 2) the voltage drop needed across the current source $I_X$, and 3) the voltage drop across transistors N1 or N2. These voltage drops or differences set the low limit of the voltage swing (i.e., the minimum voltage to which the voltage can swing).

The level shifting mechanism according to the invention shifts up the common mode voltage by reducing the voltage drop across R1 and/or R2, thereby increasing the voltage overhead or room for the voltage swing.

According to one embodiment, which is described in greater detail hereinafter with reference to FIGS. 3 and 4, the level shifting mechanism includes a first current source for providing a first level shifting current and a second current source for providing a second level shifting current. According to another embodiment, which is described in greater detail hereinafter with reference to FIG. 5, the mechanism includes a first current source for providing a first level shifting current, a second current source for providing a second level shifting current, a third current source for providing a third level shifting current, and a fourth current source for providing a fourth level shifting current.

Figure 3:
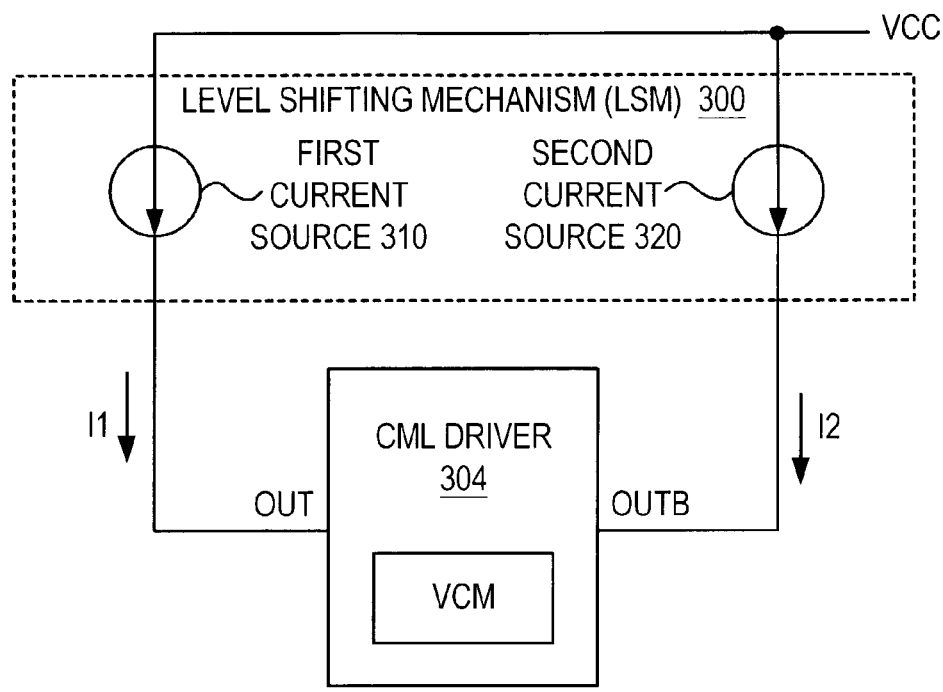
FIG. 3 illustrates in greater detail the level shifting mechanism according to one embodiment of the present invention in which two current sources are employed to shift up the common mode voltage of the current mode logic driver.

FIG. 3 illustrates in greater detail a level shifting mechanism 300 according to one embodiment of the present invention in which two current sources are employed to shift up the common mode voltage of the current mode logic driver (CML) 304. The level shifting mechanism 300 is coupled to a common logic driver 304 that has an output node (OUT), a complementary output node (OUTB), and a common mode voltage (VCM).

The level shifting mechanism 300 includes a VCM pull up mechanism that includes a first current source 310 coupled to the output node (OUT) for injecting a first current (I1) into the output node (OUT) and a second current source 320 coupled to the complementary output node (OUTB) for injecting a second current (I2) into the complementary output node (OUTB).

As current (e.g., I1 and I2) is injected into the output nodes (OUT and OUTB), the voltage drop across resistors R1 and R2, respectively, decreases, thereby increasing the output voltage presented at OUT and OUTB and the common mode voltage (VCM). The current that normally flows through the resistors R1 and R2 is offset or decreased by the injected current I1 and I2. In this regard, as the current flowing through resistors R1 and R2 decreases, the voltage drop across the resistors R1 and R2 consequently also decreases in a proportional manner.

Figure 4:
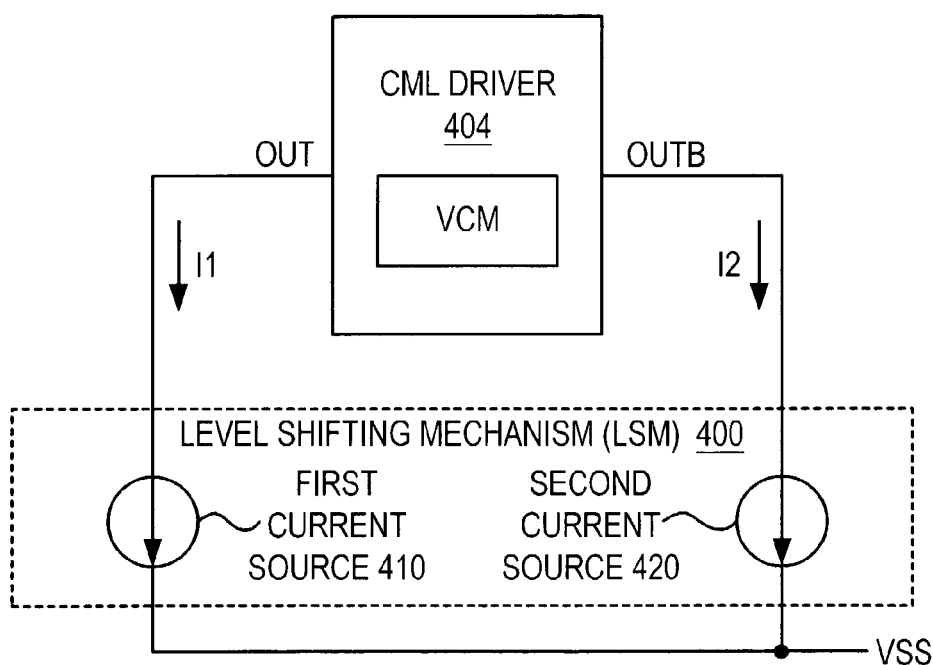
FIG. 4 illustrates in greater detail the level shifting mechanism according to another embodiment of the present invention in which two current sources are employed to shift down the common mode voltage of the current mode logic driver.

FIG. 4 illustrates in greater detail the level shifting mechanism 400 according to another embodiment of the present invention in which two current sources are employed to shift down the common mode voltage of a current mode logic driver (CML) 404. The level shifting mechanism 400 is coupled to a common logic driver 404 that has an output node (OUT), a complementary output node (OUTB), and a common mode voltage (VCM).

The level shifting mechanism 400 includes a VCM pull down mechanism that includes a first current source 410 coupled to the output node (OUT) for drawing a first current (I1) from the output node (OUT) and a second current source 420 coupled to the complementary output node (OUTB) for drawing a second current (I2) from the complementary output node (OUTB).

As current (e.g., I1 and I2) is drawn from the output nodes (OUT and OUTB), the voltage drop across resistors R1 and R2, respectively, increases, thereby decreasing the output voltage presented at OUT and OUTB and the common mode voltage (VCM). The current that normally flows through the resistors R1 and R2 is added to or increased by the drawn current I1 and I2. In this regard, as the current flowing through resistors R1 and R2 increases, the voltage drop across the resistors R1 and R2 consequently also increases in a proportional manner.

Figure 5:
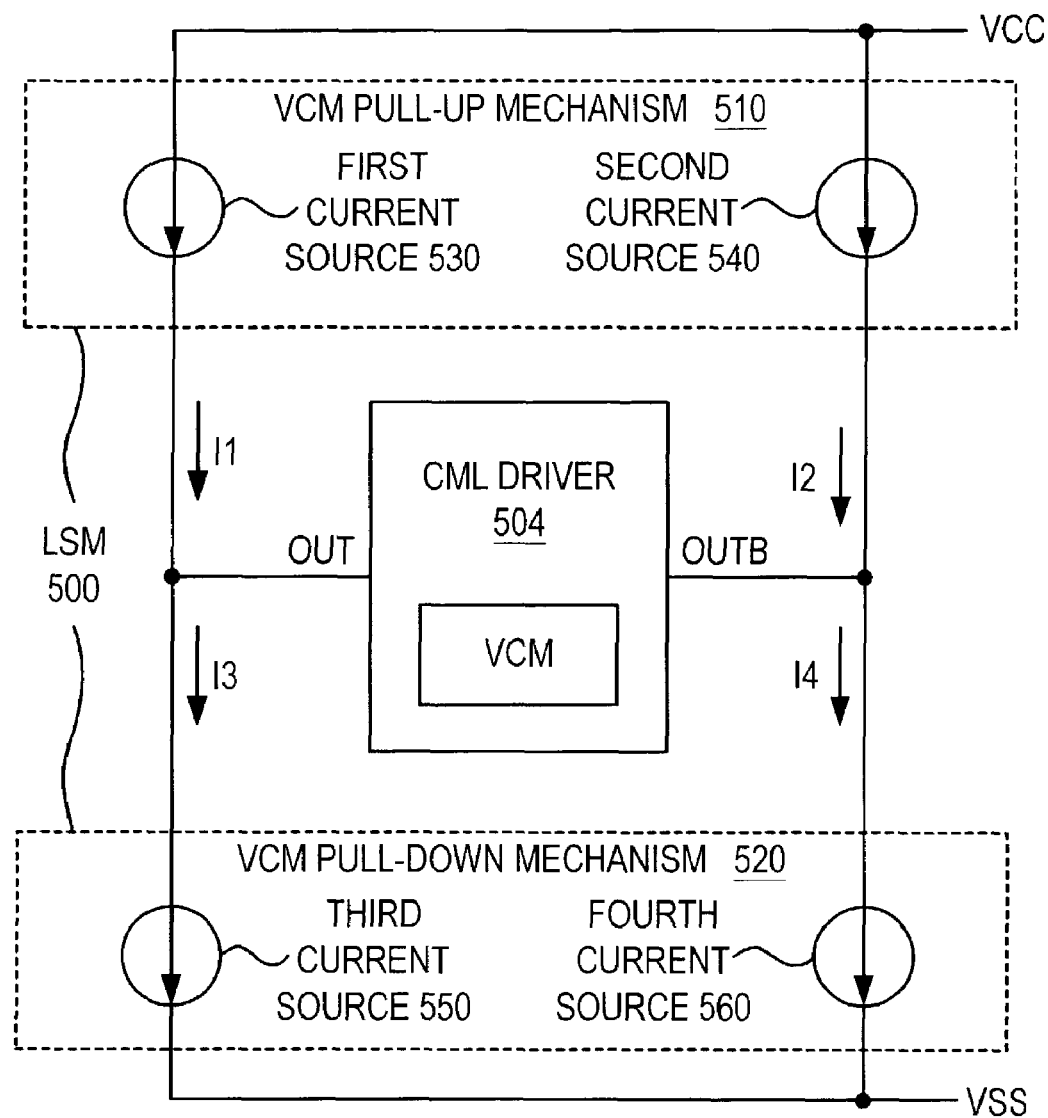
FIG. 5 illustrates in greater detail the level shifting mechanism according yet to another embodiment of the present invention in which two current sources are employed to shift up the common mode voltage of the current mode logic driver and two current sources are employed to shift down the common mode voltage of the current mode logic driver.

FIG. 5 illustrates in greater detail the level shifting mechanism 500 according yet to another embodiment of the present invention in which two current sources are employed to shift up the common mode voltage of the current mode logic driver (CML) 504 and two current sources are employed to shift down the common mode voltage of the current mode logic driver (CML) 504. The level shifting mechanism 500 is coupled to a common logic driver 504 that has an output node (OUT), a complementary output node (OUTB), and a common mode voltage (VCM).

The level shifting mechanism 500 includes a VCM pull up mechanism 510 and a VCM pull-down mechanism 520. The VCM pull-up mechanism 510 that includes a first current source 530 coupled to the output node (OUT) for injecting a first current (I1) into the output node (OUT) and a second current source 540 coupled to the complementary output node (OUTB) for injecting a second current (I2) into the complementary output node (OUTB).

As current (e.g., I1 and I2) is injected into the output nodes (OUT and OUTB), the voltage drop across resistors R1 and R2, respectively, decreases, thereby increasing the output voltage presented at OUT and OUTB and the common mode voltage (VCM). The current that normally flows through the resistors R1 and R2 is offset or decreased by the injected current I1 and I2. In this regard, as the current flowing through resistors R1 and R2 decreases, the voltage drop across the resistors R1 and R2 consequently also decreases in a proportional manner.

The VCM pull down mechanism 520 includes a third current source 550 coupled to the output node (OUT) for drawing a third current (I3) from the output node (OUT) and a fourth current source 560 coupled to the complementary output node (OUTB) for drawing a fourth current (I4) from the complementary output node (OUTB).

As current (e.g., I3 and I4) is drawn from the output nodes (OUT and OUTB), the voltage drop across resistors R1 and R2, respectively, increases, thereby decreasing the output voltage presented at OUT and OUTB and the common mode voltage (VCM). The current that normally flows through the resistors R1 and R2 is added to or increased by the drawn current I3 and I4. In this regard, as the current flowing through resistors R1 and R2 increases, the voltage drop across the resistors R1 and R2 consequently also increases in a proportional manner.

In one embodiment, when the common mode voltage (VCM) is at a desired level, the level shifting mechanism according to the invention turns all of the current sources (530, 540, 550, and 560) OFF. When the common mode voltage (VCM) is too low, the level shifting mechanism according to the invention turns the first and second current sources (530 & 540) ON and turns the third and fourth current sources (550 & 560) OFF. When the common mode voltage (VCM) is too high, the level shifting mechanism according to the invention turns the first and second current sources (530 & 540) OFF, and turns the third and fourth current sources (550 & 560) ON.

It is noted that the current sources employed in the level shifting mechanism according to the invention can be implemented in a variety of ways that are known to those of ordinary skill in the art. In one embodiment, the current sources shown in FIGS. 3, 4, and 5 can be implemented with one or more field effect transistor (FET) operating in saturation region. An exemplary implementation of the level shifting mechanism according to the invention is described in greater detail with reference to FIG. 6.

Exemplary Embodiment of Level Shifting Mechanism

Figure 6:
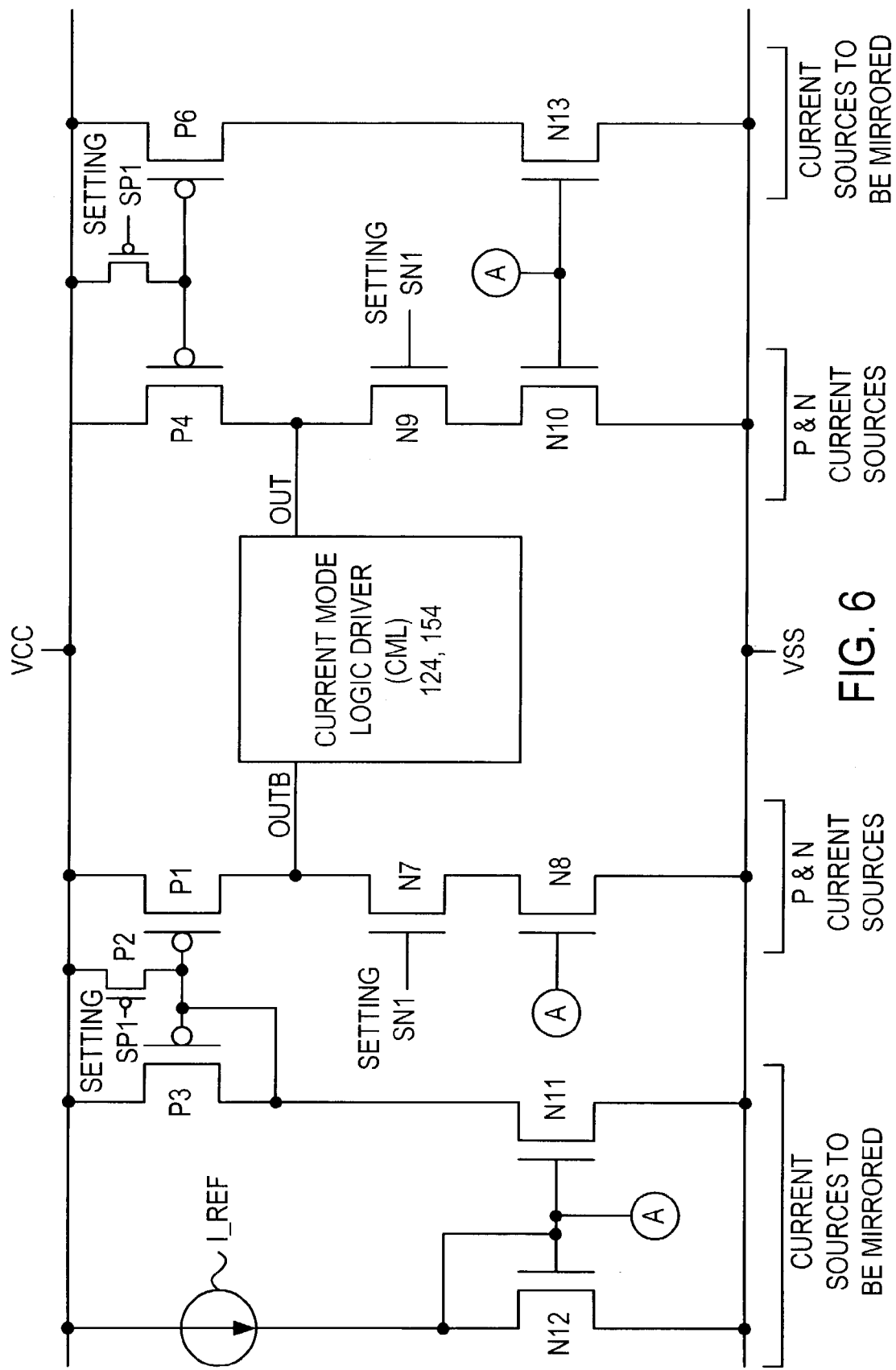
FIG. 6 illustrates in greater detail the level shifting mechanism of FIG. 5 according to one embodiment of the invention.

FIG. 6 illustrates in greater detail the level shifting mechanism 500 of FIG. 5 according to one embodiment of the invention. In this embodiment, the level shifting mechanism 500 includes current sources to be mirrored, P and N current sources, and switches controlled by settings SN1 and SP1. Settings SN1 and SP1 can be any type of digital control (e.g., a jumper) that can be selectively set by a user.

The current sources (e.g., first current source 530, second current source 540, third current source 550, and fourth current source 560) can be implemented as cascaded FETs. When turned ON, the FETs operate in a saturation region (or "flat" region). It is noted that the current sources have a relatively high impedance with respect to the output impedance of the differential pair (e.g., transistors N1 and N2 of FIG. 2). In this regard, the differential pair output impedance is not significantly affected.

When $V_{CC}$ is low (e.g., in a low power application with $V_{CC}$ equal to 1.8V) and when the voltage swing is large, the common mode voltage is pushed low into the linear region of transistors N1 and N2 because of the voltage drop across R1 and R2. As the common mode voltage decreases, the drive waveform is degraded or distorted. The level shifting mechanism according to the invention employs current sources coupled to $V_{CC}$ to inject current into nodes OUT and OUTB to advantageously pull up the VCM in these cases. The level shifting mechanism according to the invention can also employ current sources coupled to $V_{SS}$ to draw current from nodes OUT and OUTB to advantageously pull down the VCM to a proper range to drive a next-stage differential pair, for example.

Figure 7:
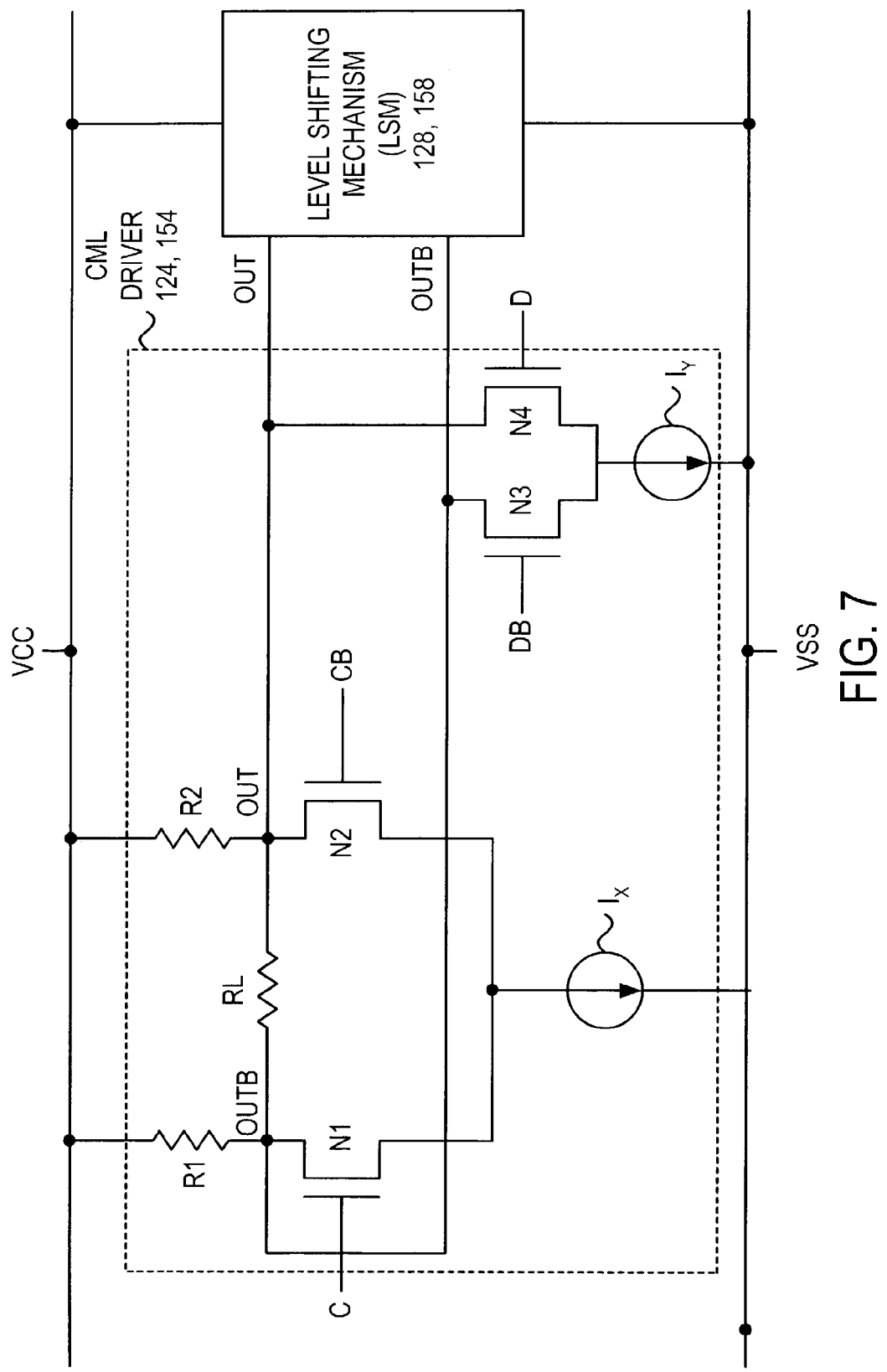
FIG. 7 illustrates in greater detail the current mode logic driver according to another embodiment of the invention.

FIG. 7 illustrates in greater detail the current mode logic driver 124, 154 according to another embodiment of the invention. The current mode logic (CML) driver includes a pre-emphasis configuration. The CML driver with pre-emphasis configuration generates a drive waveform with a pre-emphasis bit swing.

In one embodiment, the pre-emphasis configuration includes two CML differential pairs in parallel. A first differential pair (transistors N1 and N2) sets the fundamental bit swing, and a second differential pair (transistors N3 and N4) sets the pre-emphasis bit swing. The first CML differential pair (transistors N1 and N2) receives the current data and its complement (e.g., C and CB), respectively, as input. The second CML differential pair (transistors N3 and N4) receives the delayed-by-one-bit data and its complement (e.g., D and DB), respectively, as input. The current source $I_X$ is employed for establishing the fundamental bit swing, and the current source $I_Y$ is employed for modulation (e.g., establishing the pre-emphasis bit swing). R1 can equal R2 and be an exemplary value, such as 50 ohms. The load resistance ($R_L$) can be, for example, 100 ohms. The load resistance ($R_L$) can represent a next stage (e.g., the traces of a printed circuit board (PCB) or cables).

FIG. 8 illustrates an exemplary output signal waveform 800 without pre-emphasis. FIG. 9 illustrates exemplary output signal waveforms that are level-shifted versions of the output signal waveform of FIG. 8. Specifically, FIG. 9 illustrates an exemplary output signal waveform 900 without pre-emphasis, a first output signal waveform 910 that has a common mode voltage that is shifted-up with respect to waveform 900 and a second output signal waveform 920 that has a common mode voltage that is shifted-down with respect to waveform 900. The output signal waveform 900 has a common mode voltage (VCM0). The first output signal waveform 910 has a common mode voltage (VCM1) that is shifted-up with respect to waveform 900. For example, the relationship between VCM0 and VCM1 can be as follows: VCM1=VCM0+ΔV, where ΔV represents a change in voltage. The second output signal waveform 920 has a common mode voltage (VCM(−1)) that is shifted-down with respect to waveform 900. For example, the relationship between VCM0 and VCM(−1) can be as follows: VCM(−1)=VCM0−ΔV, where ΔV represents a change in voltage. It is noted that the common mode voltage (VCM) is equal to $(V_{OUT}+V_{OUTB})/2$. The common mode voltage (VCM) is also equal to $(V_{OH}+V_{OL})/2$, where $V_{OH}$ represents the output high voltage, and $V_{OL}$ represents the output low voltage.

Figure 10:
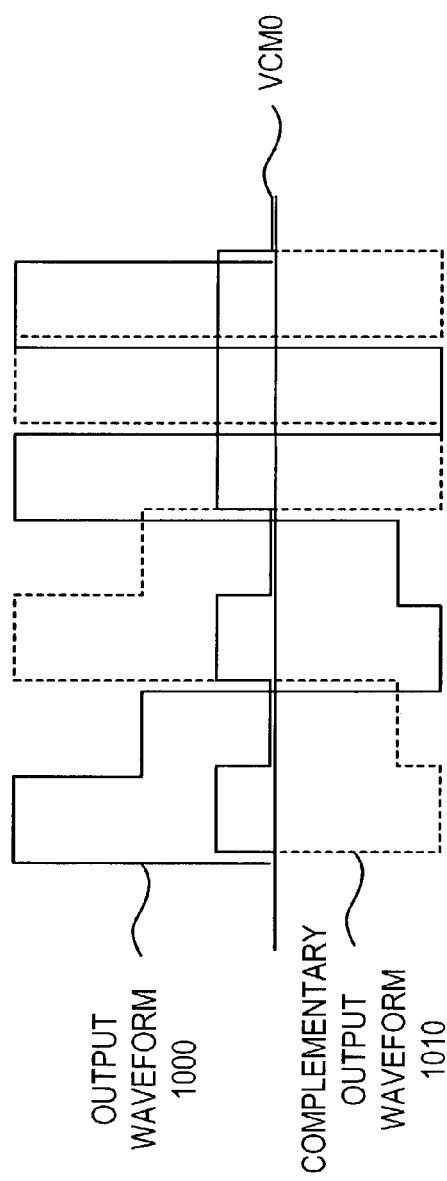
FIG. 10 illustrates an exemplary output signal waveform and its complement with poor common mode voltage variation.

FIG. 10 illustrates an exemplary output signal waveform 1000 and its complement 1010 with poor common mode voltage variation. In this example, the common mode voltage is too low, thereby causing the lower portions of the waveform to be distorted (e.g., clipped). The waveform distortion or clipping causes the variation in common mode voltage (VCM0) to increase, which is not desirable in some applications.

Figure 11:
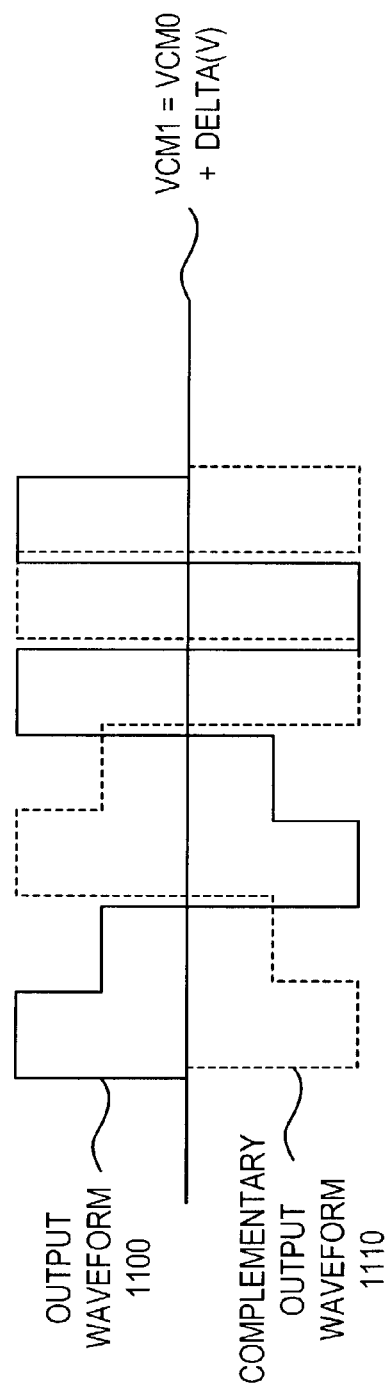
FIG. 11 illustrates an exemplary output signal waveform and its complement with improved common mode voltage variation provided by the level shifting mechanism according to the invention.

FIG. 11 illustrates an exemplary output signal waveform 1100 and its complement 1110 with improved common mode voltage variation provided by the level shifting mechanism according to the invention. By shifting the common mode voltage from VCM0 to VCM1, the waveform distortion or clipping is prevented, thereby increasing signal integrity, which may be important for certain applications.

In other applications, it may be more important to meet a specific common mode voltage specification (e.g., a common mode voltage below a predetermined voltage level). In this case, the driver according to the invention may be employed to shift the common mode voltage down to meet the common mode specifications.

Processing Steps

Figure 12:
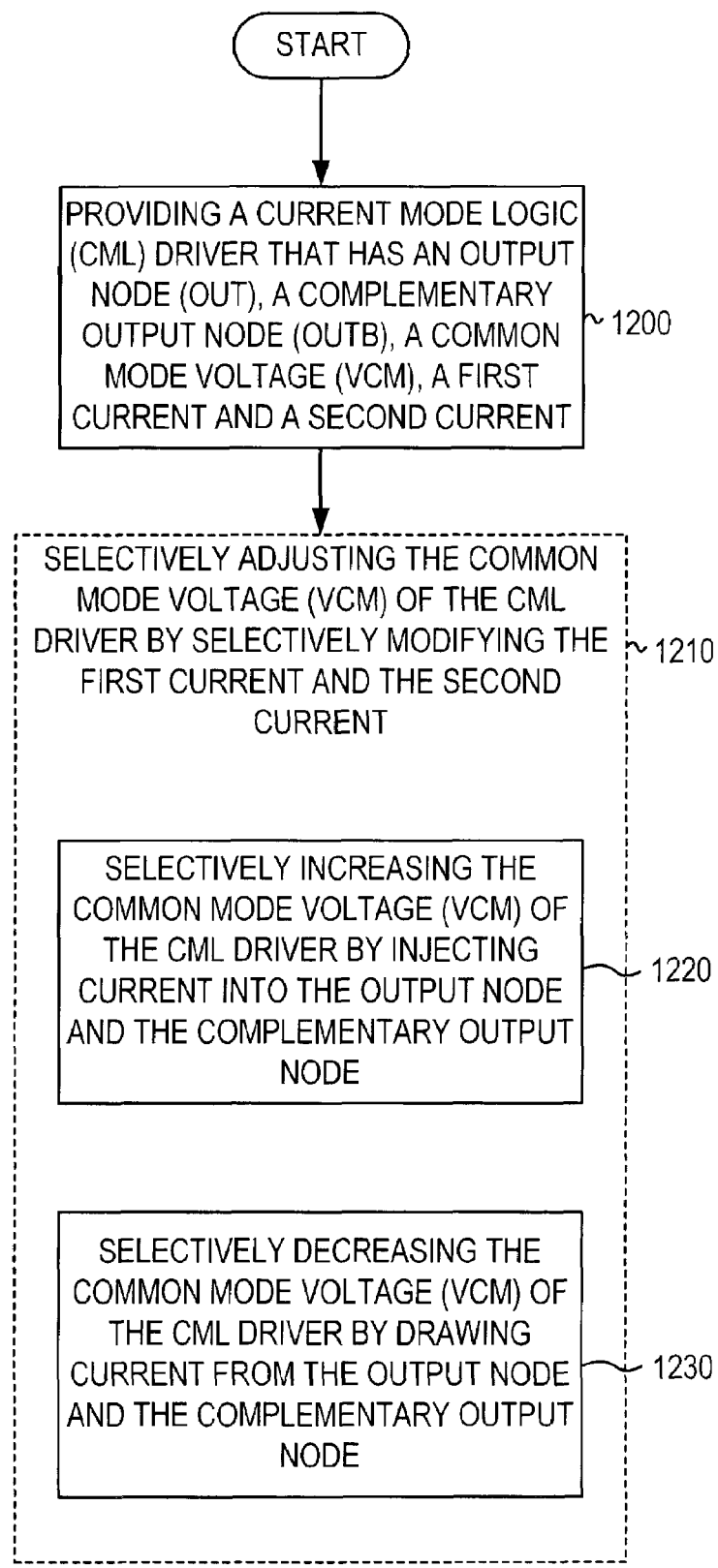
FIG. 12 illustrates a flowchart of the processing steps performed by the level shifting mechanism according to one embodiment of the invention.

FIG. 12 illustrates a flowchart of the processing steps to utilize the level shifting mechanism according to one embodiment of the invention. In step 1200, a CML driver that includes an output node (OUT), a complementary output node (OUTB), and a common mode voltage (VCM) is provided. The current mode logic dr 0 iver also includes a first current path and a second current path. A first current flows through the first current path and a second current flows through the second current path. In step 1210, the common mode voltage (VCM) of the CML driver is selectively adjusted by modifying the first current in the first current path and the second current in the second current path. Step 1210 can include the sub-step 1220 of selectively increasing the common mode voltage (VCM) of the CML driver by injecting current into the output node and the complementary output node. Step 1210 can also include the sub-step 1230 of selectively decreasing the common mode voltage (VCM) of the CML driver by drawing current from the output node and the complementary output node.

Although the level shifting mechanism of the invention has been described by the various embodiments shown in FIGS. 2, 3, 4, 5 and 6, other arrangements can be devised in accordance with the teachings of the invention to realize other wave form shaping circuits that employ level shifting mechanisms.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A circuit comprising:
   a current mode logic (CML) driver that generates an output signal that includes a common mode voltage (VCM), wherein the current mode logic (CML) driver includes an output node and a complementary output node; and
   a level shifting mechanism, coupled to the output node and the complementary output node of the CML driver, that adjusts the common mode voltage (VCM) of the output signal; wherein the level shifting mechanism includes a VCM pull up mechanism that pulls up the common mode voltage (VCM); wherein the VCM pull up mechanism includes a first current source coupled to the output node that injects a first level shifting current into the output node; and a second current source coupled to the complementary output node that injects a second level shifting current into the complementary output node.

2. The circuit of claim 1 wherein the level shifting mechanism further includes
   a VCM pull down mechanism for pulling down the common mode voltage (VCM) by drawing a level shifting current from the output node and the complementary output node.

3. The circuit of claim 2 wherein the VCM pull down mechanism includes
   a third current source coupled to the output node that draws a first current from the output node; and
   a fourth current source coupled to the complementary output node that draws a second current from the complementary output node.

4. The circuit of claim 3
   wherein the third current source includes at least one field effect transistor (FET) operating in saturation region; and
   wherein the fourth current source includes at least one field effect transistor (FET) operating in saturation region.

5. The circuit of claim 1
   wherein the first current source includes at least one field effect transistor (FET) operating in saturation region; and
   wherein the second current source includes at least one field effect transistor (FET) operating in saturation region.

6. The circuit of claim 1 wherein the current mode logic (CML) driver includes
   a current source having a first electrode for coupling with a first predetermined voltage and a second electrode;
   a first transistor having a drain electrode coupled to the complementary output node, a source electrode coupled to the second electrode of the current source, and a gate electrode for coupling to an input node;
   a second transistor having a drain electrode coupled to the output node, a source electrode coupled to the second electrode of the current source, and a gate electrode for coupling to a complementary input node;
   a first resistor having a first electrode for coupling to the drain electrode of the first transistor and a second electrode for coupling to a second predetermined voltage; and
   a second resistor having a first electrode for coupling to the drain electrode of the second transistor and a second electrode for coupling to the second predetermined voltage.

7. The circuit of claim 1 integrated in one of an electronic module and a fiber optic module.

8. The circuit of claim 7 wherein the electronic module includes one of an electronic transmitter, electronic receiver, and an electronic transceiver; and
   wherein the fiber optic module includes one of a fiber optic transmitter, a fiber optic electronic receiver, and a fiber optic electronic transceiver.

9. The circuit of claim 1 wherein the current mode logic (CML) driver includes
   a pre-emphasis configuration for generating a drive waveform with a pre-emphasis bit swing; wherein the pre-emphasis configuration includes
   a first differential pair for setting a fundamental bit swing; and
   a second differential pair in parallel with the first differential pair for setting the pre-emphasis bit swing.

10. A method for generating a drive waveform comprising the steps of:
    providing a CML driver that includes an output node (OUT), a complementary output node (OUTB), and a common mode voltage (VCM), a first current path, a second current path, a first current flowing through the first current path, and a second current flowing through the second current path; and
    selectively adjusting the common mode voltage by utilizing a first current source and a second current source to modify the first current in the first current path and the second current in the second current path, respectively.

11. The method of claim 10 wherein the step of selectively adjusting the common mode voltage by utilizing a first current source and a second current source to modify the first current in the first current path and the second current in the second current path includes
    shifting up the common mode voltage by injecting current into the output node and the complementary output node.

12. The method of claim 10 wherein the step of selectively adjusting the common mode voltage by utilizing a first current source and a second current source to modify the first current in the first current path and the second current in the second current path includes
    shifting down the common mode voltage by drawing current from the output node and the complementary output node.

13. A circuit comprising:
    a current mode logic (CML) means for generating a drive waveform that includes a common mode voltage (VCM), wherein the current mode logic (CML) means includes an output node and a complementary output node; and means, coupled to the output node and the complementary output node of the CMI means, for adjusting the common mode voltage (VCM) wherein the common mode voltage adjustment means further includes means for pulling up the common mode voltage (VCM); wherein the VCM pull up means includes first means coupled to the output node for injecting a first current into the output node; and a second means coupled to the complementary output node for injecting a second current into the complementary output node.

14. The circuit of claim 13 wherein the common mode voltage adjustment means further includes
means for pulling down the common made voltage (VCM) by drawing a level shifting current from the output node and the complementary output node.

15. The circuit of claim 14 wherein the VCM pull down means includes
third means coupled to the output node for drawing a third current from the output node; and
fourth means coupled to the complementary output node for drawing a fourth current from the complementary output node.

16. A circuit comprising:
a current mode logic (CML) driver that generates an output signal that includes a common mode voltage (VCM), wherein the current mode logic (CML) driver includes an output node and a complementary output node; wherein the current mode logic (CML) driver includes a pre-emphasis configuration for generating a drive waveform with a pre-emphasis bit swing; wherein the pre-emphasis configuration includes a first differential pair for setting a fundamental bit swing; and a second differential pair in parallel with the first differential pair for setting the pre-emphasis bit swing; and
a level shifting mechanism, coupled to the output node and the complementary output node of the CML driver, that adjusts the common mode voltage (VCM) of the output signal.

17. The circuit of claim 16 wherein the level shifting mechanism further includes
a VCM null down mechanism that pulls down the common mode voltage (VCM); wherein the VCM pull down mechanism includes a first current source coupled to the output node that draws a first level shifting current from the output node; and a second current source coupled to the complementary output node that draws a second level shifting current from the complementary output node; and
a VCM pull up mechanism that pulls tip the common mode voltage (VCM) by injecting a level shifting current into the output node and the complementary output node.

18. The circuit of claim 17 wherein the VCM pull up mechanism includes
a third current source coupled to the output node that injects a third level shifting current from the output node; and
a fourth current source coupled to the complementary output node that injects a fourth level shifting current from the complementary output node.

19. The circuit of claim 18
wherein the third current source includes at least one field effect transistor (FET) operating in saturation region; and
wherein the fourth current source includes at least one field effect transistor (FET) operating in saturation region.

20. The circuit of claim 17
wherein the first current source includes at least one field effect transistor (FET) operating in saturation region; and
wherein the second current source includes at least one field effect transistor (FET) operating in saturation region.

* * * * *

UNITED STATES PATENT AND TRADEMARK OFFICE
CERTIFICATE OF CORRECTION

PATENT NO. : 7,180,333 B2  Page 1 of 1
APPLICATION NO. : 10/445171
DATED : February 20, 2007
INVENTOR(S) : Pei-Der Tseng It is certified that error appears in the above-identified patent and that said Letters Patent is hereby corrected as shown below:

Title Page; item (56); col. 2, line 7 and 8;
Delete "1,8-V" and
insert -- 1.8-V --, therefor.
After "Carmine" delete ";".

Col. 13, line 2;
In Claim 13 delete "CMI" and
insert -- CML --, therefor.

Col. 13, line 13;
In Claim 14, delete "made" and
insert -- mode --, therefor.

Col. 13, line 23;
In Claim 16, delete "comprising;" and
insert -- comprising: --, therefor.

Col. 14, line 3;
In Claim 17, delete "null" and
insert -- pull --, therefor.

Col. 14, line 11;
In Claim 17, delete "tip" and
insert -- up --, therefor.

Signed and Sealed this

Twenty-ninth Day of July, 2008

JON W. DUDAS
*Director of the United States Patent and Trademark Office*